United States Patent
Hall, Jr.

[11] Patent Number: 6,020,551
[45] Date of Patent: Feb. 1, 2000

[54] MULTI-WIRE SELF-DIAGNOSTIC THERMOCOUPLE

[75] Inventor: Bertie Forrest Hall, Jr., Ann Arbor, Mich.

[73] Assignee: Hoskins Manufacturing Company, Detroit, Mich.

[21] Appl. No.: 08/086,150

[22] Filed: Jul. 1, 1993

[51] Int. Cl.$^7$ ................................................. H01L 35/28
[52] U.S. Cl. ........................ 136/227; 136/233; 374/179
[58] Field of Search .................................. 136/224, 227, 136/230, 231, 232, 233; 374/179, 181, 182, 208

[56] References Cited

U.S. PATENT DOCUMENTS

| | | | |
|---|---|---|---|
| 2,609,406 | 9/1952 | Barsy | 136/4 |
| 2,631,220 | 3/1953 | Barsy | 219/47 |
| 2,696,118 | 12/1954 | Petry | 73/359 |
| 3,048,641 | 8/1962 | Erlebacher | 136/4 |
| 3,232,794 | 2/1966 | Korton | 136/4 |
| 3,343,589 | 9/1967 | Holzl | 164/46 |
| 3,449,174 | 6/1969 | Kleinle | 136/228 |
| 4,224,461 | 9/1980 | Snyder, Jr. et al. | 136/233 |

FOREIGN PATENT DOCUMENTS 675473  12/1963  Canada ................................. 374/179

*Primary Examiner*—Kathryn Gorgos
*Assistant Examiner*—Thomas H. Parsons
*Attorney, Agent, or Firm*—Brooks & Kushman P.C.

[57] ABSTRACT

A multi-wire self-diagnostic thermocouple having three thermocouple elements enclosed in a sheath and insulated therefrom. The three thermocouple elements are electrically connected to each other to form three thermocouple junctions. An electronic circuit response to the three EMF signals generated by the three thermocouple junctions generates an error signal when the ratio between the three EMF signals differs from predetermined ratios signifying that the calibration of at least one of the three thermocouple elements has changed. In the preferred embodiment, the sheath is a metal sheath and the three thermocouple elements are fused to each other and to the metal sheath.

13 Claims, 2 Drawing Sheets

MULTI-WIRE SELF-DIAGNOSTIC THERMOCOUPLE

TECHNICAL FIELD

The invention is related to the field of thermocouples and, in particular, to a three wire thermocouple which permits detection of a change in its calibration.

BACKGROUND ART

A change in the calibration of a thermocouple can cause the equipment being monitored or controlled to be operated at a temperature different from the temperature indicated. This may cause damage to the equipment being controlled or the product in the case of a process. Currently, the accuracy of an installed thermocouple can be obtained by placing a second thermocouple of known calibration beside the installed thermocouple and comparing the relative indicated temperatures. This is not always easy to do and requires periodic checking to be effective.

The use of two thermocouple elements within a metal sheath is taught by Burley in U.S. Pat. No. 4,909,855, by Thom et al in U.S. Pat. No. 4,778,537 and by Hollander in U.S. Pat. No. 5,111,002, while a temperature indicating device using three thermocouple elements is taught by Petry in U.S. Pat. No. 2,696,118.

SUMMARY OF THE INVENTION

The invention is a multi-wire, self-diagnostic thermocouple having at least three thermoelement enclosed in a metal sheath and insulated from each other by ceramic material. Each of the thermoelement has thermoelectric constants which are different from the thermoelectric constants of the other two. The three thermoelement are electrically connected to each other at one end of the multi-wire thermocouple to form at least three thermocouple junctions.

In a self-diagnostic system, the thermo-electromotive forces generated at the three thermocouple junctions are compared to generate difference signals having a predetermined value. The value of the difference signals is then compared with upper limit and lower reference signals to generate an error signal when the difference signals exceed an upper limit reference signal or are less than a lower limit reference signal.

In the preferred embodiment, three thermoelement are enclosed in a common sheath. In an alternate embodiment, the three thermoelement are individually enclosed in separate metal sheaths and connected to each other and to the metal sheaths at one end thereof to form multiple thermocouple junctions.

One advantage of the multi-wire self-diagnostic thermocouple is that the multiple thermocouple junctions are installed together as a single element.

Another advantage is that the calibration of the thermocouple is constantly monitored.

Still another advantage is that the three thermocouple elements may be enclosed in a single metal sheath.

These and other advantages will become more apparent from a reading of the detailed description of the invention in conjunction with the appended drawings.

DETAILED DESCRIPTION OF THE INVENTION

Figure 1:
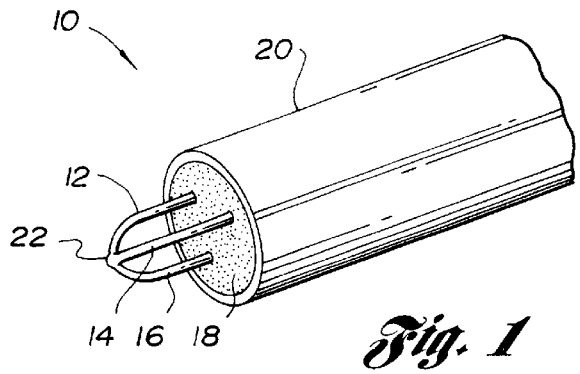
FIG. 1 is a perspective view of the multi-wire thermocouple.

Referring to FIG. 1, there is shown a multi-wire thermocouple 10 having three thermoelements 12, 14 and 16 enclosed in a sheath 20, preferably made of a metal or other electrically conductive material. The thermoelements 12, 14 and 16 are insulated from each other and the sheath 20 by a ceramic or mineral insulating material 18. The three thermoelements 12, 14 and 16 are fused to each other, as indicated by a bead 22, preferably a weld bead, to form three different thermocouple junctions. The thermoelectric constants of the thermoelements 12 and 14 are selected to have a desired thermo-electromotive force (EMF) in a selected operating temperature range.

The thermo-electromotive force (EMF) generated by a thermocouple is given by the equation:

$$EMF = A_{xy}\theta^2 + B_{xy}\theta$$

where:

$\theta$ is the temperature difference between the hot and cold junctions of the thermocouple made from metals x and y.

$$A_{xy} = A_x - A_y,$$

$$B_{xy} = B_x - B_y$$

where $A_x$ and $B_x$ are the thermoelectric constants of the thermocouple element x, and $A_y$ and $B_y$ are the thermoelectric constants of the thermocouple element Y.

Figure 4:
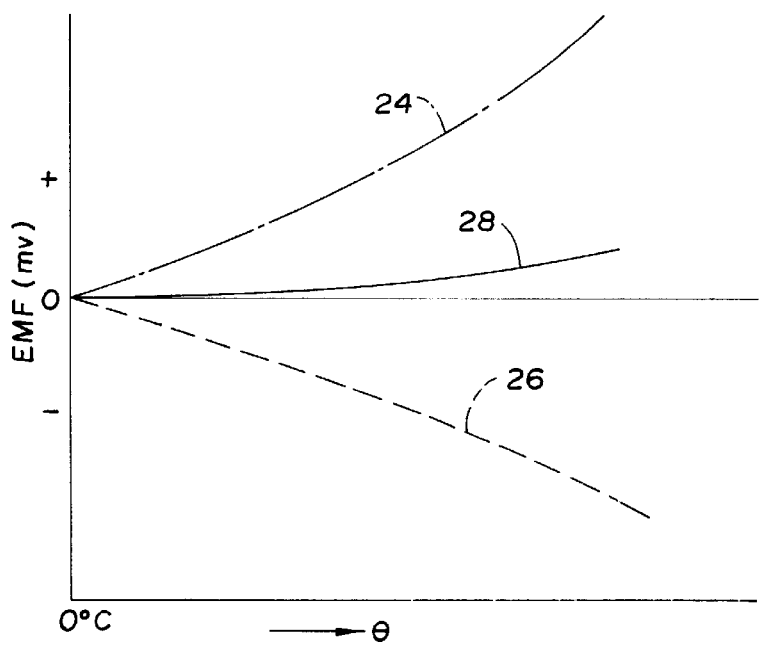
FIG. 4 is a graph showing the thermo-electromotive force characteristics of the thermoelement used in the example.

The third thermoelement 16 is selected to have thermoelectric constants A and B intermediate the thermoelectric constants of the thermocouple elements 12 and 14. For example, thermoelement 12 may be a CHROMEL-P wire which generates a positive thermo-electromotive force. As indicated by curve 24 in the graph shown in FIG. 4, the thermo-electromotive force of the CHROMEL-P thermoelement 12 will increase in a positive direction with an increase in temperature $\theta$. In contrast, the thermoelement 14 may be an ALUMEL wire which generates a negative thermo-electromotive force indicated as curve 26 in the graph of FIG. 4. As a result, the thermo-electromotive force of the ALUMEL thermoelement 14 will increase in a negative direction with an increase of the temperature $\theta$. The thermoelectromotive force (millivolts) of the thermocouple junction formed between thermoelements 12 and 14 at any given temperature difference $\theta$ between the hot and cold junctions will be equal to the difference between curves 24 and 26.

The thermocouple element 16 may be pure iron or a stainless steel alloy wire, which generates a thermoelectromotive force intermediate the thermoelectromotive forces of the CHROMEL-P and ALUMEL thermoelements 12 and 14, respectively. The thermoelectromotive force of the thermo-elements 16, as a function of the temperature θ, is indicated by curve 28 in FIG. 4. The thermo-electromotive force output of the thermocouple junction between the CHROMEL-P thermoelement 12 and the thermoelement 16 is the difference between curves 24 and 28 for any given temperature difference θ between their cold and hot junctions. In a like manner, the electromotive output of the thermocouple junction between the ALUMEL thermoelement 14 and the thermoelement 16 is the difference between curves 26 and 28 for any given temperature difference θ between their hot and cold thermocouple junctions.

Using the multiple thermocouple junctions formed by the multi-wire thermocouple, it is possible to detect a change in the calibration of the primary thermocouple junction. In the given example, that thermocouple junction is formed between the CHROMEL-P thermoelement 12 and the ALUMEL thermoelement 14. Change in calibration is detected by simultaneously measuring the electromotive force generated by the thermocouple junctions between the thermoelement 16 and the CHROMEL-P thermoelement 12, the thermoelement 16 and the ALUMEL thermoelement 14 and the thermoelement 12 and the thermoelement 14.

Figure 5:
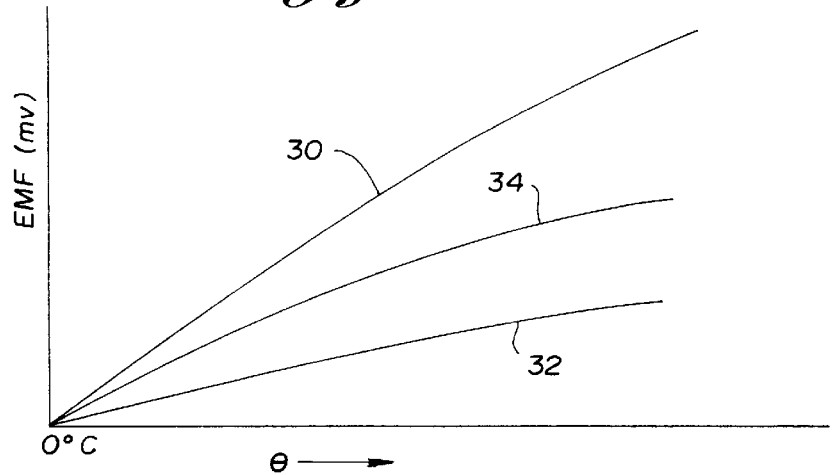
FIG. 5 is a graph showing the EMF generated by the three thermocouple junctions as a function of temperature.

FIG. 5 is a graph showing the thermo-electromotive force (EMF) output, curve 30, of the CHROMEL-P/ALUMEL thermocouple as a function of the temperature difference θ between the hot and cold junctions. Curve 32 indicates the EMF output of an iron/Chromel-P® thermocouple as a function of the temperature difference θ. Curve 34 indicates the EMF output of an iron/ALUMEL thermocouple of a temperature difference θ between the hot and cold junctions. As may be seen from the graph, in a given temperature differential range, there is a fixed ratio between curves 30, 32 and 34. For example, at a given temperature θ:

$$\frac{EMF_{30}}{EMF_{32}} = X; \frac{EMF_{30}}{EMF_{34}} = Y; \frac{EMF_{32}}{EMF_{34}} = Z;$$

Figure 6:
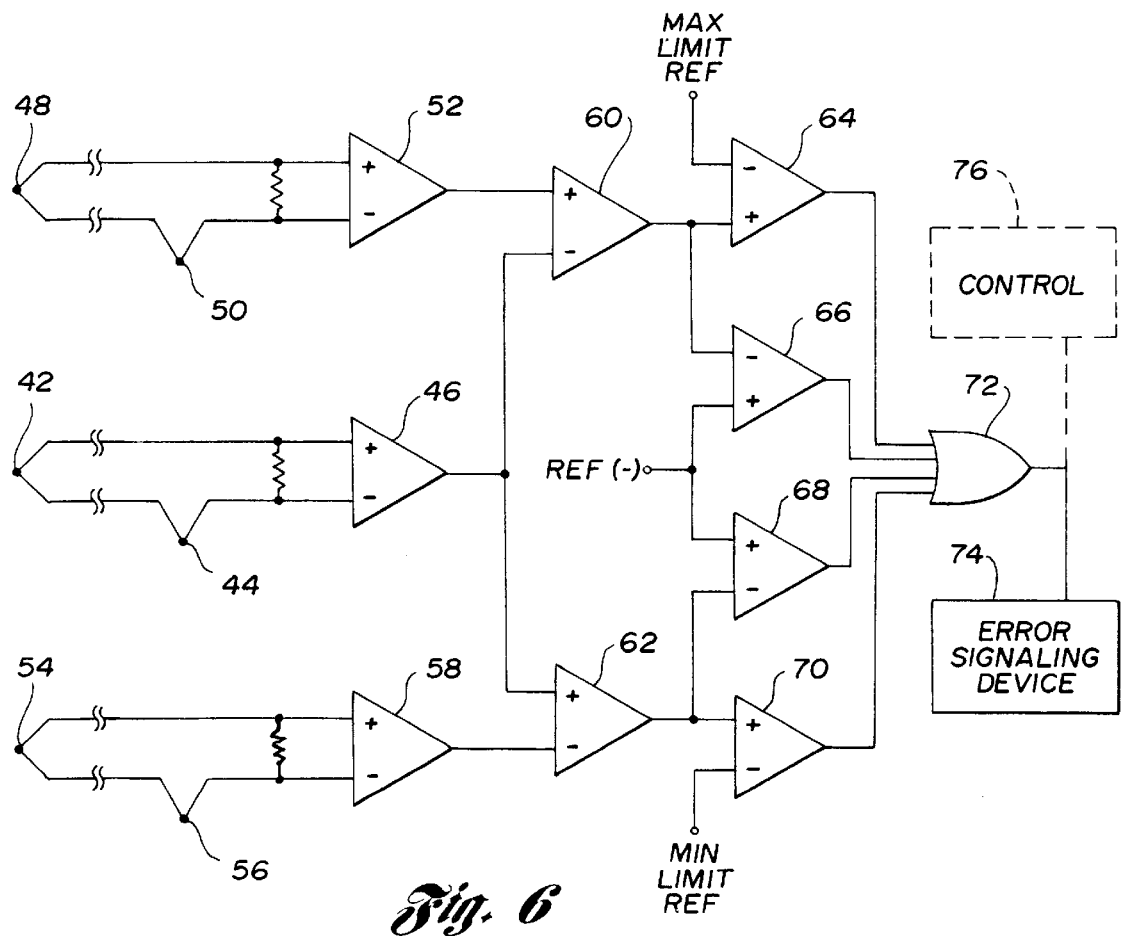
FIG. 6 is a circuit for detecting an error in calibration in at least one of the three thermoelement.

A change in calibration of the CHROMEL-P/ALUMEL thermocouple may be detected by an electrical circuit shown in FIG. 6. Referring to FIG. 6, the EMF produced between a hot junction 42 and a cold junction 44 of the CHROMEL-P/ALUMEL thermocouple is applied across the positive and negative inputs to a first operation amplifier 46 which generates at its output a signal having a value which is a predetermined function of the EMF generated. In a like manner, the EMF generated between the hot junction 48 and the cold junction 50 of the iron/ALUMEL thermocouple is applied across the positive and negative inputs to a second operational amplifier 52 which generates a signal having a value which is a predetermined function of the generated EMF. The EMF generated between the hot junction 54 and the cold junction 56 of the CHROMEL-P/iron thermocouple applied across a third operational amplifier 58. The operational amplifier 58 generates an output signal having a value which also is a function of the generated EMF.

The gains of the operational amplifiers 46, 52 and 58 are selected so that their outputs are substantially equal, at least within a selected temperature range. The outputs of operational amplifiers 46 and 52 are received at the negative and positive inputs of a difference amplifier 60 which outputs a first signal having a predetermined value. In a like manner, the outputs of operational amplifiers 46 and 58 are received at the positive and negative inputs of a difference amplifier 62 which outputs a second signal having said predetermined value. The predetermined value output from the difference amplifier 60 is compared with a maximum limit reference signal and a minimum limit reference signal in comparators 64 and 66 which will generate an output when the output of difference amplifier 60 is greater than the maximum limit reference signal or less than the minimum limit reference signal.

In a like manner, the output signal of difference amplifier 62 is compared with the minimum limit reference signal and the maximum limit reference signal in comparators 68 and 70, respectively, which outputs a signal when the output of difference amplifier 62 is less than the minimum limit reference signal or greater than the minimum limit reference signal.

The output signals generated by comparators 64, 66, 68 and 70 are applied to either an error signaling device 74 to a control 76 or both through an OR gate 72, signifying that the predetermined ratios between the EMFs of the three thermocouples no longer exit, indicating the calibration of one of the thermocouples has changed.

In the preferred embodiment, the gains of the operational amplifiers are selected so that the potential of their output signals are substantially equal. As a result, the output signals of difference amplifiers 60 and 62 are substantially zero (0) when none of the three thermocouple junctions have deteriorated. The maximum limit and minimum limit signals are then a small positive and small negative signal, respectively.

The error signaling device 74 may be a visual signal, such as a red or blinking light. Alternatively, the error signaling device may generate an audible signal or a combination of visual and audible signals.

The control 76 may, in response to an error signal generated by any one of the comparators 64, 66, 68 or 70, shut down the device it is controlling or place it in a fail-safe mode of operation.

The functions performed by the circuit shown in FIG. 6 may be performed by a circuit arrangement different from the one shown or by a programmed microprocessor. The programmed microprocessor may be a separate element or a thermocouple calibration test subroutine of the control's microprocessor, which is executed at preselected time intervals.

Figure 2:
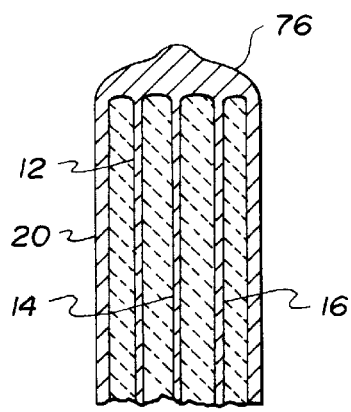
FIG. 2 is a cross-sectional view of a preferred embodiment of the multi-wire thermocouple.

The three thermoelements 12, 14 and 16 may be fused to each other to form the thermocouple junctions as previously described or may also be fused to the sheath 20, as shown in FIG. 2 when the sheath 20 is a metal sheath. The thermoelements and the metal sheath may be fused to form a bead 76 enclosing the end of the multi-wire thermocouple 10 and electrically connecting the thermoelements 12, 14 and 16 to each other and to the metal sheath 20.

Figure 3:
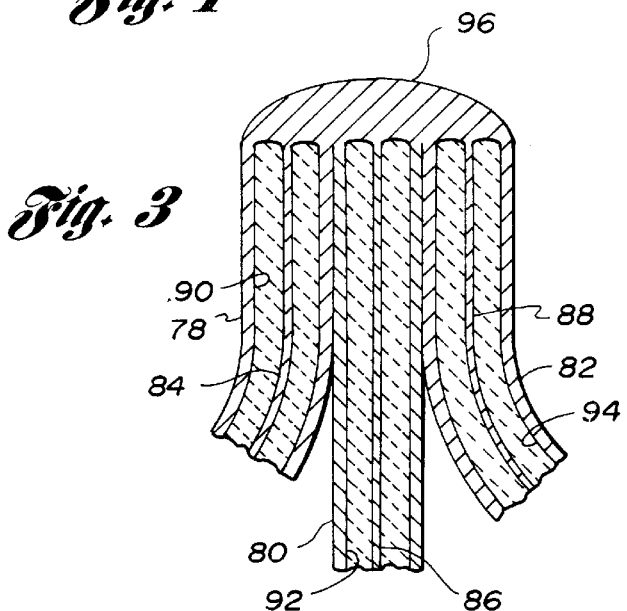
FIG. 3 is a cross-sectional view of an alternate embodiment of the self-diagnostic thermocouple.

In an alternate embodiment shown in FIG. 3, the ends of three separate coaxial thermoelements 78, 80 and 82 are fused to each other to form the three thermocouple junctions as previously described with reference to FIG. 2. Each coaxial thermoelement 78, 80 and 82 has a coaxial thermoelement 84, 86 an 88, respectively, and a metal sheath 90, 92 and 94. The metal sheaths 90, 92 and 94 are filled with a ceramic powder insulating the enclosed thermoelements 84, 86 and 88 from their respective metal sheaths. The ends of the three coaxial thermoelements are fused, forming a common weld bead 96 electrically connecting the three thermoelements 84, 86 and 88 to each other and to each of the metal sheaths 90, 92 and 94, respectively. The thermocouple junctions formed by fusing the ends of the three coaxial thermoelements 78, 80 and 82 are effectively identical to fusing the three thermoelements 12, 14 and 16 to each other as shown in FIG. 1 or fusing the three thermoelements 12, 14 and 16 to the metal sheaths 20, as shown in FIG. 2.

It is not intended that the invention be limited to a multi-wire thermoelement having a CHROMEL-P, an ALUMEL and iron thermoelements, used in the example, but rather is applicable to any other combination of thermoelements having suitable thermoelectric properties.

Having disclosed a preferred and alternate embodiment of the invention, and a method for detecting a change in the calibration of the thermocouple, it is recognized that others skilled in the art may make certain changes and improvements within the scope of the invention as set forth in the appended claims.

What is claimed is:

1. A self-diagnostic thermocouple system comprising:

three thermoelements connected to each other to form at least two different thermocouple junctions, one of said thermocouple junctions producing a first signal having a value which is a first function of a sensed temperature, the other of said at least two different thermocouple junctions producing a second signal having a value which is a second function of said sensed temperature; and means for comparing said first signal to said second signal to generate an error signal in response to a ratio between said first and second signals being different from a first predetermined ratio indicative of at least one limiting value between said first and second signals, said error signal signifying a change in the calibration of one of said at least two thermocouple junctions.

2. The self-diagnostic thermocouple system of claim 1 further comprising:

a metal sheath circumscribing said three thermoelements; and insulating material disposed in said metal sheath electrically insulating said three thermoelements from each other and said metal sheath.

3. The self-diagnostic thermocouple system of claim 2 wherein said three thermoelements have a fused connection electrically connecting said three thermoelements to said metal sheath.

4. The self-diagnostic thermocouple system of claim 1 further comprising:

three metal sheaths, each of said three metal sheaths circumscribing a respective one of said three thermoelements; and insulating material disposed in each of said three metal sheaths electrically insulating said thermoelement in each sheath from said metal sheath.

5. The self-diagnostic thermocouple system of claim 4 wherein said three thermoelements are further fused at one end to said metal sheaths.

6. The self-diagnostic thermocouple system of claim 1 wherein said means for comparing comprises:

means for amplifying at least one of said first and second signals by a value predetermined to generate an amplified signal having a value such that the ratio between said amplified signal and the other of said first and second signals has a predetermined value;

means for amplifying the difference between said amplified signal and the other of said first and second signal to generate a difference signal having a value indicative of the ratio between said amplified signal and the other of said first and second signals;

means for comparing said difference signal with a first reference value to generate an error signal when said difference signal has a value greater than said first reference value;

means for comparing said difference signal with a second reference signal to generate said error signal in response to said difference signal having a value less than said second reference value; and an error signaling device operative to generate an alarm signal in response to said error signal.

7. The self-diagnostic thermocouple system of claim 6 wherein said value of said difference signal is substantially a zero value and wherein said first reference signal is a predetermined positive potential and said second reference signal is a predetermined negative potential.

8. The self-diagnostic thermocouple system of claim 1 wherein said at least two thermocouple junctions comprise three thermocouple junctions, a third of said three thermocouple junctions producing a third signal having a value which is a function of a sensed temperature; and wherein said means for comparing compares said third signal to at least one of said first and second signals to generate an error signal in response to the ratio between said third signal and said at least one of said first and second signals being different from a second predetermined ratio.

9. The self-diagnostic thermocouple system of claim 8 further comprising:

a sheath circumscribing said three thermoelements;

insulating material disposed in said sheath electrically insulating said three thermoelements from each other and from said sheath; and a fused connection provided at one end of said sheath electrically connecting at least said thermoelements to each other to form said three thermocouple junctions.

10. The self-diagnostic system of claim 8 wherein said means for comparing comprises:

means for amplifying said first, second and third signals to generate at least two difference signals;

means for comparing said at least two difference signals to a first reference signal to generate an error signal when at least one of said at least two difference signals has a value greater than said first reference signal; and means for comparing said at least two difference signals to a second reference signal to generate an error signal when at least one of said at least two difference signals is less than said second reference signal.

11. The self-diagnostic system of claim 8 further including an error signaling device.

12. The self-diagnostic system of claim 8 wherein said three thermoelements are three coaxial thermoelements, each coaxial thermoelement having a coaxial metal sheath circumscribing a respective one of said three thermoelements and insulating material disposed in said metal sheath electrically insulating said thermoelement from said metal sheath.

13. The self-diagnostic system of claim 12 wherein said metal sheaths and said three thermoelements are fused to each other.

* * * * *